US010355235B2

(12) United States Patent
Wang et al.

(10) Patent No.: US 10,355,235 B2
(45) Date of Patent: Jul. 16, 2019

(54) ORGANIC LIGHT EMITTING DISPLAY DEVICE AND APPARATUS

(71) Applicants: SHANGHAI TIANMA AM-OLED CO., LTD., Shanghai (CN); TIANMA MICRO-ELECTRONICS CO., LTD., Shenzhen (CN)

(72) Inventors: Xiangcheng Wang, Shanghai (CN); Shuang Cheng, Shanghai (CN); Jinghua Niu, Shanghai (CN); Yuji Hamada, Shanghai (CN); Wei He, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/641,190

(22) Filed: Jul. 3, 2017

(65) Prior Publication Data

US 2017/0309861 A1     Oct. 26, 2017

(30) Foreign Application Priority Data

Dec. 30, 2016   (CN) .......................... 2016 1 1257161

(51) Int. Cl.
*H01L 51/00* (2006.01)
*H01L 51/52* (2006.01)
*H01L 51/50* (2006.01)

(52) U.S. Cl.
CPC ........ *H01L 51/5212* (2013.01); *H01L 51/508* (2013.01); *H01L 51/5056* (2013.01); *H01L 51/5072* (2013.01); *H01L 51/5275* (2013.01); *H01L 51/0058* (2013.01); *H01L 51/0072* (2013.01); *H01L 51/5008* (2013.01); *H01L 51/5036* (2013.01)

(58) Field of Classification Search
None
See application file for complete search history.

(56) References Cited

U.S. PATENT DOCUMENTS

2016/0133880 A1* 5/2016 Lee .................. H01L 51/5281
                                                               257/40
2016/0308162 A1* 10/2016 Yoo .................. H01L 27/3244

FOREIGN PATENT DOCUMENTS

| CN | 102244202 A | 11/2011 |
| CN | 102956839 A | 3/2013 |
| CN | 103579521 A | 2/2014 |

(Continued)

*Primary Examiner* — Nicholas J Lee
(74) *Attorney, Agent, or Firm* — Kilpatrick Townsend & Stockton LLP

(57) ABSTRACT

Embodiment of the present disclosure discloses an organic light emitting display device and apparatus, the organic light emitting display device includes a first electrode and a second electrode disposed opposite to each other, a light emitting layer positioned between the first electrode and the second electrode, and a cap layer positioned on a side surface of the second electrode facing away from the light emitting layer, wherein the cap layer includes at least two composite layers, the refractive index of the composite layer of the at least two composite layers closer to the second electrode is greater than that of the other composite layer further away from the second electrode in the range of wavelength of 400 nm to 700 nm.

18 Claims, 11 Drawing Sheets

(56) References Cited

FOREIGN PATENT DOCUMENTS

| | | |
|---|---|---|
| CN | 103928489 A | 7/2014 |
| CN | 104904031 A | 9/2015 |
| CN | 105161584 A | 12/2015 |

* cited by examiner

ORGANIC LIGHT EMITTING DISPLAY DEVICE AND APPARATUS

CROSS-REFERENCE TO RELATED APPLICATIONS

This application claims priority to a Chinese patent application No. 20161127161.4 filed on Dec. 30, 2016 and titled "Organic Light Emitting Display Device and Apparatus", which is incorporated herein by reference in its entirety.

TECHNICAL FIELD

Embodiments of the present disclosure relate to an organic light emitting display technology, and more particularly, to an organic light emitting display device and apparatus.

BACKGROUND

An organic light-emitting display (OLED) device is a thin film light-emitting device made of organic semiconductor material and driven by direct current voltage, which has the characteristics of lightness, large viewing angle and power saving. With the commercialized application and development of the display devices, requirements of a pixel fineness and a light extraction efficiency of the OLED device required by the commercialized products are increasingly higher. In order to improve the light extraction efficiency, the existing OLED devices usually utilize a top-emitting mode.

A top-emitting OLED device of the prior art is illustrated in FIG. 1. The OLED device includes a substrate 10, an anode 11, a hole transport layer 12, a light emitting layer 13, an electron transport layer 14, a cathode 15, and a cap layer 16, and the light is emitted from the top of the device. Specifically, the constituent materials of the electron transport layer 14 is an organic material doped with LiQ; the constituent materials of the cathode 15 is an alloy of Mg and Ag; and the constituent materials of the cap layer 16 is an organic material.

In the existing organic light emitting display device, the cap layer is made of the organic material, which has the effects of high refractive index and high light extraction efficiency, but the color cast phenomenon is serious.

SUMMARY

An embodiment of the present disclosure provides an organic light emitting display device and apparatus to improve the color cast phenomenon of the organic light emitting display device.

An aspect of an embodiment of the present disclosure provides an organic light emitting display device, which includes:

a first electrode and a second electrode disposed opposite to each other, a light emitting layer positioned between the first electrode and the second electrode; and a cap layer positioned on a side surface of the second electrode facing away from the light emitting layer, the cap layer includes at least two composite layers, the refractive index of the composite layer of the at least two composite layers closer to the second electrode is greater than that of the other composite layer further away from the second electrode in the range of wavelength of 400 nm to 700 nm.

Another aspect of an embodiment of the present disclosure further provides an organic light emitting display apparatus including the organic light emitting display device as described above.

According to the organic light emitting display device and apparatus provided by the embodiments of the present disclosure, the cap layer includes at least two composite layers, the refractive index of the composite layer of the at least two composite layers closer to the second electrode is greater than that of the other composite layer further away from the second electrode, in the range of wavelength of 400 nm to 700 nm. In the embodiment of the present disclosure, the refractive index of the composite layer in the cap layer closer to the second electrode is relatively larger, and the light reflection effect can be reduced, thereby improving the light extraction efficiency of the device. The refractive index of the other composite layer in the cap layer further away from the second electrode is relatively smaller, and a certain reflection phenomenon may occur during propagation of light from the composite layer closer to the second electrode to the other composite layer further away from the second electrode, such that the emission angle of the light is increased and the light is scattered in different directions to reduce the color cast phenomenon. Therefore, the color cast is mitigated by virtue of the cap layer while the higher light extraction efficiency of the device can be ensured.

BRIEF DESCRIPTION OF DRAWINGS

In order to more clearly illustrate the embodiments of the present disclosure or the technical solutions in the prior art, the accompanying drawings, which are intended to be used in the description of the embodiments or the prior art, are briefly described as below, and it will be apparent that the drawings in the following descriptions are some embodiments of the present disclosure, and other drawings may be obtained by those skilled in the art according to these drawings without paying any inventive work.

DETAILED DESCRIPTION

The technical solution provided by the present disclosure will be clearly described below by way of embodiments thoroughly, with reference to the accompanying drawings of the embodiments of the present disclosure, in order to make the objects, technical solutions and the advantages of the present disclosure clearer. It is apparent that the embodiments described are a portion of the embodiments of the present invention, but not all of the embodiments. All other embodiments obtained by those of ordinary skill in the art without paying any creative work are within the scope of the present disclosure, based on the embodiments of the present disclosure.

Figure 1:
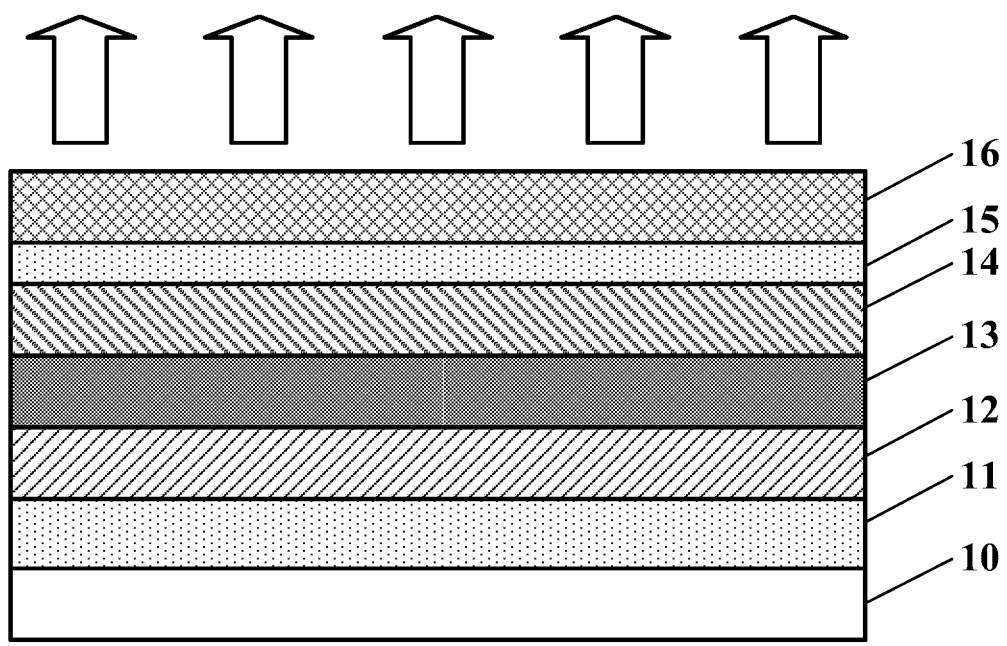
FIG. 1 is a schematic view of a top-emitting OLED device according to the prior art.
Figure 2:
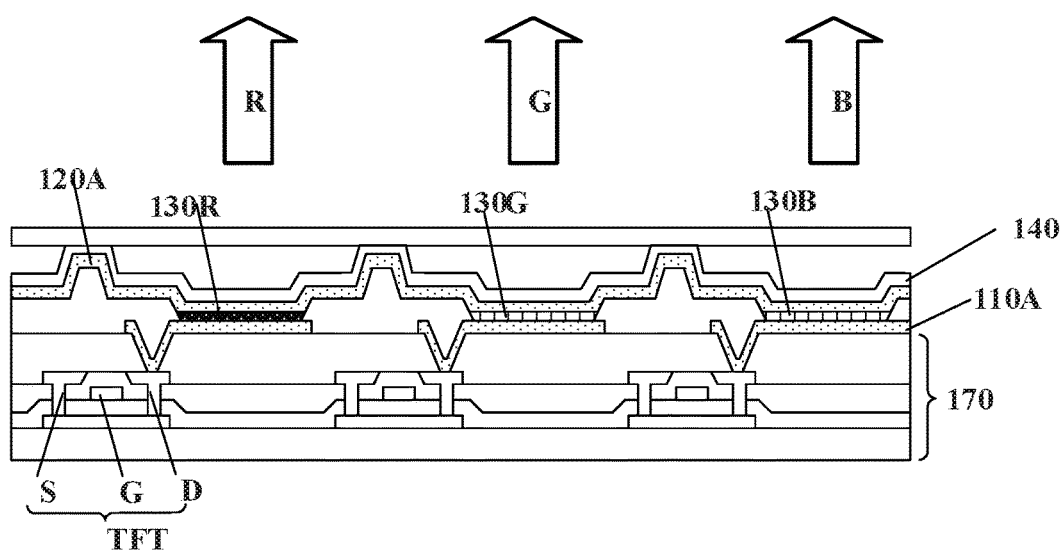
FIG. 2 is a schematic view of an organic light emitting display device according to an embodiment of the present disclosure.

FIG. 2 is a schematic view of an organic light emitting display device according to an embodiment of the present disclosure. The organic light emitting display device includes a first substrate 170 and an upper substrate, a TFT array positioned between the first substrate 170 and the upper substrate, an anode 110A, a light emitting layer 130R corresponding to an R pixel region, a light emitting layer 130G corresponding to a G pixel region, a light emitting layer 130B corresponding to a B pixel region, a cathode 120A, and a cap layer 140. The organic light emitting display device is a top-emitting OLED, in which a microcavity structure is formed between the anode 110A and the cathode 120A. The luminous mechanism of the organic light emitting display device is such that, in the case of emitting a red light, a positive voltage is applied to the anode 110A corresponding to the R pixel region and a negative voltage is applied to the cathode 120A, and the holes generated by the anode 110A are injected into the corresponding light emission layer 130R, the electrons generated by the cathode 120A are also injected into the corresponding light emitting layer 130R; the electrons and holes that are injected into the light emitting layer 130R are recombined to generate excitons, and radiation transition of the excitons causes the light emitting layer 130R to emit the red light.

In order to clearly describe the technical solution of the present disclosure, only the partial structure of the organic light emitting display device is described and illustrated in the following embodiments as an example.

Figure 3:
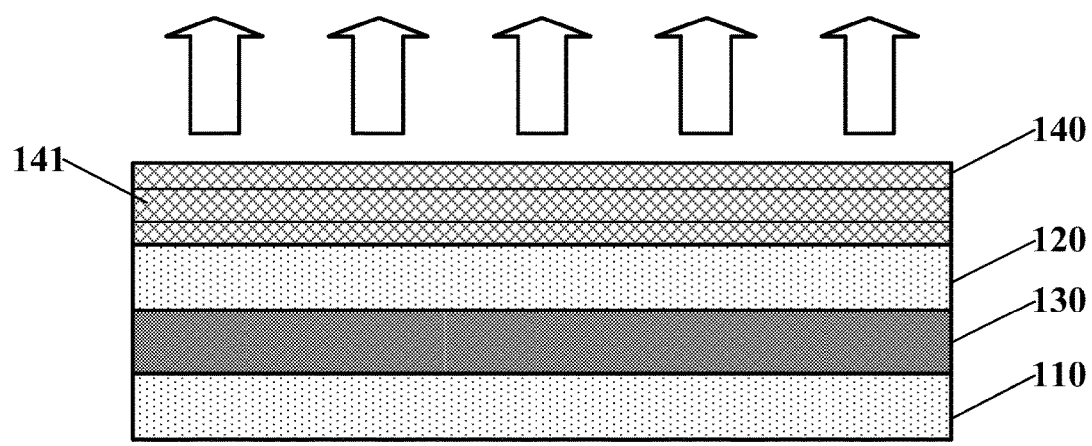
FIG. 3 is a schematic view of an organic light emitting display device according to an embodiment of the present disclosure.

FIG. 3 is a schematic view of an organic light emitting display device according to one embodiment of the present disclosure. The organic light emitting display device includes a first electrode 110 and a second electrode 120 disposed opposite to each other, a light emitting layer 130 positioned between the first electrode 110 and the second electrode 120, and a cap layer 140 located at a side surface of the second electrode 120 facing away from the light emitting layer 130. The cap layer 140 includes at least two composite layers 141, in which the refractive index of the composite layer 141 of the at least two composite layers 141 closer to the second electrode 120 is greater than that of the other composite layer 141 further away from the second electrode 120 in the range of wavelength of 400 nm to 700 nm.

In the present embodiment, the optional organic light emitting display device is a top-emitting display device, and the light is emitted from a side at the second electrode 120. The first electrode 110 and the second electrode 120 constitute a microcavity structure of the organic light emitting display device, and the microcavity structure has a microcavity effect. The organic light emitting display device includes the cap layer 140 which can be used to adjust the length of the microcavity and thereby affecting the microcavity effect. Specifically, the cap layer 140 is actually formed on a side surface of the cathode 120A facing away from the first substrate 170 in the organic light emitting display device shown in FIG. 2.

In the present embodiment, the cap layer 140 includes at least two composite layers 141. That is, the cap layer 140 is a multi-layer structure, and the refractive index of the composite layer 141 of the at least two composite layers 141 closer to the second electrode 120 is greater than that of the other composite layer 141 further away from the second electrode 120 in the range of wavelength of 400 nm to 700 nm. In the this embodiment, the refractive index of the composite layer 141 closer to the second electrode 120 is relatively large, then the light reflection effect can be reduced, thereby improving the light extraction efficiency of the device. The refractive index of the composite layer 141 further away from the second electrode 120 is relatively small, and the process which the light is propagated from the composite layer 141 closer to the second electrode 120 to the other composite layer 141 further away from the second electrode 120 is a process which the light is ropagated from the optical dense medium to the optical sparse medium.

It is known that when the light is propagated from the optical dense medium to the optical sparse medium, reflection occurs at an interface between the light dense medium and the optical sparse medium. Therefore, in the present embodiment, a certain reflection occurs at an interface between the composite layer 141 closer to the second electrode 120 and the other composite layer 141 further away from the second electrode 120, further the emission angle of light is increased and the light is scattered in different directions, thereby reducing the color cast phenomenon.

It will be understood by those skilled in the art that the cap layer can improve the light extraction efficiency, the refractive index difference between any two materials of the cap layer is relatively small, but the constituent materials of the composite layer of the cap layer in the present disclosure is any of existing known material for the cap layer. Therefore, the refractive index of the composite layer closer to the second electrode is considerably greater than that of the other composite layer further away from the second electrode in the present disclosure, but the refractive index difference is not very large based on the fact that they both are materials for the cap layer. Accordingly, a partial reflection of the light, rather than a full reflection of the light, occurs at the interface between the composite layer closer to the second electrode and the other composite layer further away from the second electrode, and the reflection will slightly reduce the light extraction efficiency of the device, whereas the composite layer closer to the second electrode can improve the light extraction efficiency. As a result, the light extraction efficiency improved by virtue of the high refractive index of the composite layer closer to the second electrode can compensate for the reduction of the light extraction efficiency caused by the reflection, thereby ensuring that the device has a higher light extraction efficiency.

In view of the above, the cap layer provided in the present embodiment also reduces the color cast phenomenon on the basis of ensuring a higher light extraction efficiency of the device.

By way of example, on the basis of the above-described technical solution, the constituent materials of the second electrode 120 includes a metal material or a metal alloy material, and the constituent materials of the first electrode 110 includes indium tin oxide (ITO) or indium zinc oxide (IZO). The constituent materials of the first electrode and the second electrode also include other materials. Specifically, the first electrode also includes silver, so the first electrode may serve as a reflective film layer so that the light is totally reflected on the first electrode. Specifically, the first electrode may act as the anode of the organic light emitting display device, thus the light may be totally reflected on the first electrode. The second electrode may act as the cathode of the organic light emitting display device, thus the light is emitted through the second electrode, so the thickness of the second electrode is very thin. It will be understood by those skilled in the art that the constituent materials of the first electrode and the second electrode are various, including but not limited to the above examples, and the relevant practitioners may select the constituent materials forming the first electrode and the second electrode according to requirements for products by themselves. The constituent materials is not limited specifically in the present disclosure. The constituent materials of the second electrode may be selected to include, for example, any one of silver alloy with magnesium, silver metal, silver ytterbium alloy and silver rare earth metal alloy. In other embodiments, the constituent materials of the second electrode may also be selected to include indium tin oxide (ITO) or indium zinc oxide (IZO), and the constituent materials of the first electrode includes a metal material or a metal alloy material.

Optionally, the metallic material is silver, and the metal alloy material is a silver alloy having a silver content of more than 90%. In the prior art, the cathode of the organic light emitting display device is made of magnesium silver alloy, Mg:Ag=9:1 or 10:1, in which the high degree of activity of the magnesium causes the cathode to be susceptible to water and oxygen to fail. In addition, the transmittance of magnesium is poor, resulting in the cathode transmittance is not high, thereby affecting the light efficiency of device. In the present embodiment, the constituent materials of the second electrode 120 is silver or a silver alloy having a silver content of more than 90%. Because the transmittance of silver is very high, and the silver having a high mass ratio is used in the second electrode 120, the transmittance of the second electrode 120 is high, and thus the light extraction efficiency of the organic light emitting display device can be improved. Specifically, the combination of the second electrode 120 and the cap layer 140 have a transmittance greater than 65%. In addition, the low degree of activity of silver facilitates the improvement of the stability of the device.

On the basis of the exemplary embodiment as described above, the light emitting layer 130 includes a plurality of light emitting regions which emit at least one color of light or only emit white light. When the plurality of light emitting regions emit the at least one color of light, the organic light emitting material used in the light emitting region corresponding to the different light emission colors of the light emitting layer 130 is different. When the plurality of light emitting regions emit the white light, the organic light emitting material used in the light emitting regions corresponding to the different light emission colors of the light emitting layer 130 may be the same. When the plurality of light emitting regions emit the white light, a plurality of color filter films respectively corresponding to the plurality of light emitting regions are arranged on the light emitting layer 130 of the organic light emitting display device, and the plurality of color filter films include at least one of a red R filter film, a green G filter film, and a blue B filter film.

It will be understood by those skilled in the art that the structure illustrated in this embodiment is only a partial structure of the organic light emitting display device, but the organic light emitting display device also includes other structures such as a thin film transistor array substrate, a color film substrate, or a thin film encapsulation layer. When a color filter film is arranged in the organic light emitting display device, the color filter film may be produced at a plurality of positions, for example, directly on the cap layer or on the color film substrate. In the present disclosure, the position at which the color filter film is produced is not limited specifically.

By way of example, the optional cap layer 140 has a thickness greater than or equal to 50 nm and less than or equal to 90 nm. When the thickness of the cap layer 140 is too thick or too thin, the light output characteristics of the cap layer 140 would be affected. It will be understood by those skilled in the art that the thickness of the cap layer is not limited to the above-described thickness range and that the relevant practitioners can set the thickness of the cap layer according to the requirements for products in actual production by themselves.

By way of example, the optional cap layer 140 includes any one or combination of an organic material and an inorganic material. When the cap layer 140 is made of the organic material, since the organic material has a higher refractive index, the light reflection phenomenon is reduced, and thus the light extraction efficiency of the device is higher. When the cap layer 140 is made of the inorganic material, the color cast phenomenon of the device can be reduced. Accordingly, the cap layer 140 may be formed by laminating the organic material film layer and the inorganic material film layer.

Figure 4:
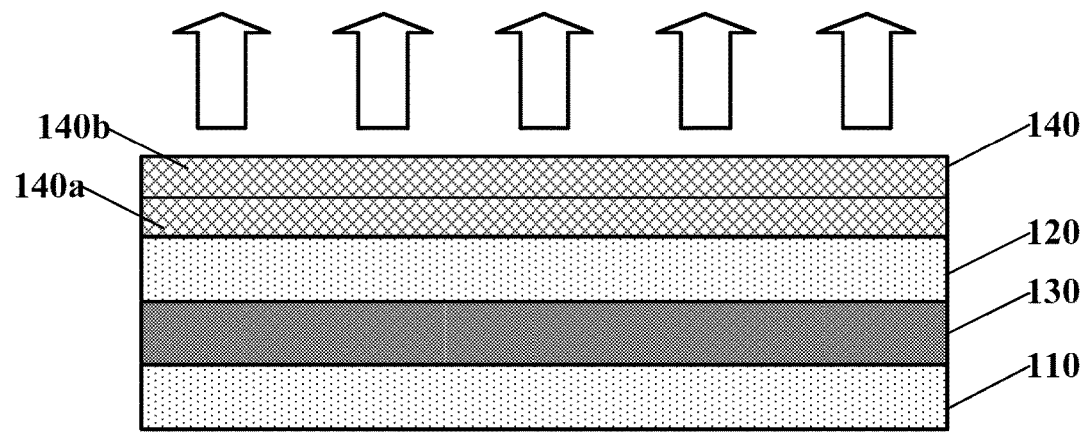
FIG. 4 is a schematic view of another organic light emitting display device according to an embodiment of the present disclosure.

As an example, the optional cap layer 140, as shown in FIG. 4, includes a first composite layer 140*a* and a second composite layer 140*b* which are stacked in turn, where the first composite layer 140*a* is in direct contact with the second electrode 120, and a refractive index of the first composite layer 140*a* is greater than 1.8 in the wavelength range of 400 nm to 700 nm, and a refractive index of the second composite layer 140*b* is less than 1.7 in the wavelength range of 400 nm to 700 nm. According to the present embodiment, the refractive index of the first composite layer 140*a* in direct contact with the second electrode 120 is relatively large, so the light reflection effect can be reduced, thereby improving the light extraction efficiency of the device. The refractive index of the second composite layer 140*b* is relatively small, so the light is transmitted from the first composite layer 140*a* to the second composite layer 140*b*. That is, the light propagates from the optical dense medium to the optical sparse medium. Therefore, a certain reflection of light occurs at the interface between the first composite layer 140*a* and the second composite Layer 140*b*. Thus, the light emission angle increases, and the light is scattered in different directions, thereby reducing the color cast phenomenon. In this way, the color cast phenomenon is improved on the basis that the light extraction efficiency of the device is ensured.

The thickness of the optional first composite layer 140*a* is 50 nm, and the thickness of the second composite layer 140*b* is 20 nm. The higher refractive index of the first composite layer 140*a* can improve the light extraction efficiency, and the relatively low refractive index of the second composite layer 140*b* can improve the color cast phenomenon, and the light can be reflected at the interface between the first composite layer 140*a* and the second composite layer 140*b*. It is known that a reflection can reduce the light extraction efficiency. In order to ensure the higher light extraction efficiency and reduce the color cast phenomenon of the device, it is preferable that the thickness of the first composite layer 140*a* is greater than that of the second composite layer 140*b*. Specifically, the thickness of the first composite layer 140*a* is 50 nm, and the thickness of the second composite layer 140*b* is 20 nm. The thicker first composite layer 140*a* can ensure that the device has a higher light extraction efficiency while the thinner second composite layer 140b can reduce the color cast phenomenon.

The optional first composite layer 140a is made of 8-hydroxyquinoline aluminum, and the second composite layer 140b is made of lithium fluoride. The refractive index of the 8-hydroxyquinoline aluminum is higher than 1.8, and the refractive index of the lithium fluoride is about 1.3 to 1.4. The refractive index difference between the first composite layer 140a and the second composite layer 140b is less, so the reflection at the interface between the first composite layer 140a and the second composite layer 140b is less, thus the high refractive index of the first composite layer 140a can improve the light extraction efficiency, meanwhile the low refractive index of the second composite layer 140b can improve the color cast phenomenon.

In the organic light emitting display device according to the present embodiment, the cap layer includes at least two composite layers, the refractive index of the composite layers of the at least two composite layers closer to the second electrode is greater than that of the other composite layer of the at least two composite layers further away from the second electrode in a wavelength range of 400 nm to 700 nm. In the present embodiment, the refractive index of the composite layer closer to the second electrode in the cap layer is relatively large, so that the light reflection effect can be reduced, and then the light extraction efficiency of the device can be improved, while the refractive index of the composite layer further away from the second electrode in the cap layer is relatively small, such that a certain light reflection phenomenon may occur during the propagation of light from the composite layer closer to the second electrode to the composite layer further away from the second electrode, and then the emission angle of the light is increased and the light is scattered in different directions, thereby reducing the color cast phenomenon. As such, the cap layer reduces the color cast phenomenon while ensuring that the device has a higher light extraction efficiency.

Figure 5A:
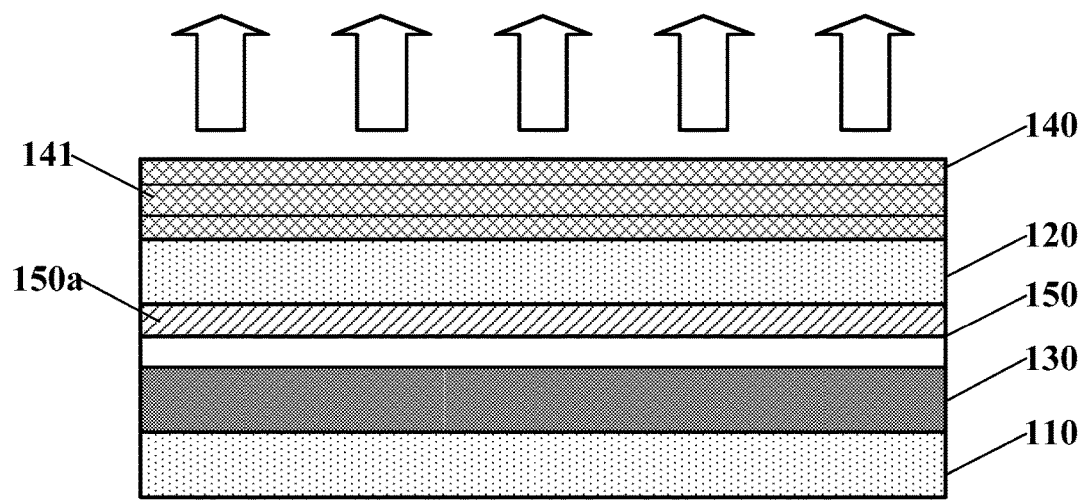
FIGS. 5A to 5C are schematic views of a plurality of organic light emitting display devices according to another embodiment of the present disclosure.

Another embodiment of the present invention provides an organic light emitting display device which differs from any of the embodiments described above in that, as shown in FIG. 5A, it further includes a first functional layer 150 with at least an electron transport layer 150a. The electron transport layer 150a is located on a side surface of the second electrode 120 facing the light emitting layer 130. A refractive index of the electron transport layer 150a is less than 1.7 in the wavelength range of 400 nm to 700 nm, and the thickness of the electron transport layer 150a is greater than or equal to 30 nm and less than or equal to 40 nm.

In the present embodiment, the first functional layer 150 is located between the light emitting layer 130 and the second electrode 120, and the first functional layer 150 includes at least an electron transport layer 150a. The first functional layer 150 is used to enhance the ability that electron of the second electrode 120 is injected and transported to the light emitting layer 130, thereby balancing the injection and transport of carriers and improving the carrier recombination efficiency. In the present embodiment, since the refractive index of the electron transport layer 150a is less than 1.7 in the wavelength range of 400 nm to 700 nm, when the electron transport layer 150a having a lower refractive index is matched with the cathode, the light transmittance can be increased, and brightness and light extraction efficiency of the device can be improved.

By way of example, on the basis of the above-described technical solution, the optional electron transport layer 150a includes an electron transporting material doped with a first guest material. The first guest material includes at least an alkali metal, an alkaline earth metal and a rare earth metal. The electron transport material includes any one of an o-phenanthroline derivative or a substituted product thereof, and a bipyridine derivative or a substituted product thereof.

According to the present embodiment, the electron transport material includes any one of the o-phenanthroline derivative or a substituted product thereof, and the bipyridine derivative or a substituted product thereof, which have the advantage that the refractive index is lower. The refractive index of the electron transport layer formed by the existing electron transport material is large, and when the light is propagated from the electron transport layer to the cathode, since the refractive index of the cathode is smaller, the refractive index difference between the electron transport layer and the cathode is large, thus the t reflection phenomenon will be caused at the interface between the electron transport layer and the cathode, thereby affecting the light extraction efficiency of device. The electron transport layer 150a formed by the electron transport material in the present embodiment has a smaller refractive index and is in contact with the second electrode 120. When the light propagates from the electron transport layer 150a toward the second electrode 120, the refractive index difference between the electron transport layer 150a and the second electrode 120 is small, and the light reflection phenomenon at the interface between the electron transport layer 150a and the second electrode 120 is weakened, thereby improving the light extraction efficiency of the device.

In the present embodiment, since the electron transport material is doped with the first guest material, the refractive index of the electron transport layer 150a can be further reduced, and then the light extraction efficiency can be further improved. The first guest material is metal material, and when the electron transport layer 150a is matched with the cathode, the first guest material in the electron transport layer 150a is capable of increasing the electron injection rate of the cathode. In the present embodiment, the first guest material is an active metal material. With the active metal being doped into the electron transport material, it is possible to improve the electrical conductivity of the electron transport layer 150a, that is to increase the electron mobility of the electron transport layer 150a, thereby reducing the light emitting voltage of the light emitting layer 130 and reducing the power consumption.

It is preferable that the electron transporting material is an o-phenanthroline derivative and the first guest material is Yb in the present embodiment. It will be understood by those skilled in the art that the electron transporting material of the electron transport layer and the first guest material include, but are not limited to, the above examples, and are not particularly limited in the present disclosure.

The content of the first guest material in the optional electron transport layer 150a is greater than or equal to 5% and less than or equal to 95%. When the content of the first guest material in the electron transport layer 150a is different, the electron mobility and the enhancement rate of electron injection and transport exhibited by the electron transport layer 150a are also different. Therefore, one skilled in the art can control the content of the first guest material in the electron transport layer in accordance with the requirements for products by themselves. The content of the first guest material is not particularly limited in the present disclosure.

Figure 5B:
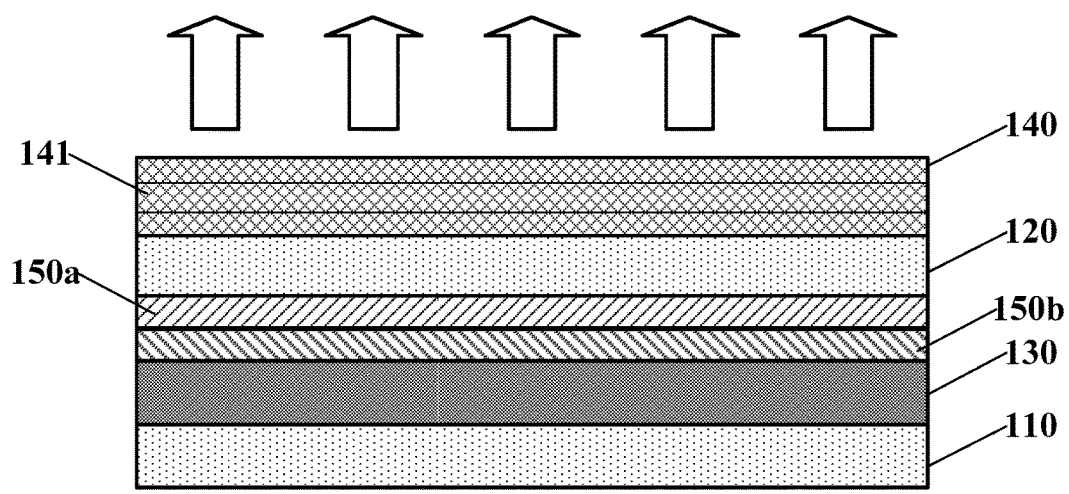

Alternatively, as shown in FIG. 5B, the first functional layer 150 further includes a hole blocking layer 150b located on a side surface of the electron transport layer 150a facing the light emitting layer 130, and the thickness of the hole blocking layer 150*b* is in the range of 5 nm to 30 nm. The difference in energy level between the electron transport layer 150*a* and the light emitting layer 130 is relatively large, which is not conducive to the electron transport. Therefore, the hole blocking layer 150*b* may be arranged between the electron transport layer 150*a* and the light emitting layer 130, and the energy level of the hole blocking layer 150*b* lies between the electron transport layer 150*a* and the light emitting layer 130, which minimizes the energy level barrier crossed when an electron transition takes place to enhance an efficiency of the electron injection and transport efficiency. It is preferable that the hole transport layer 150*b* is arranged between the electron transport layer 150*a* and the light emitting layer 130 when the content of the first guest material exceeds 25%.

In addition, the hole blocking layer 150*b* can also block the hole of the light emitting layer 130 from being transferred to the second electrode 120, that is, the hole blocking layer 150*b* is capable of restricting the holes in the light emitting layer 130 to improve the exciton recombination efficiency. It will be appreciated by those skilled in the art that the first functional layer may further include an electron injection layer and so on in other alternative embodiments, which is not only for improving the electron injection and transport capabilities, but also for minimizing the energy level barrier crossed when the electron transition takes place.

Figure 5C:
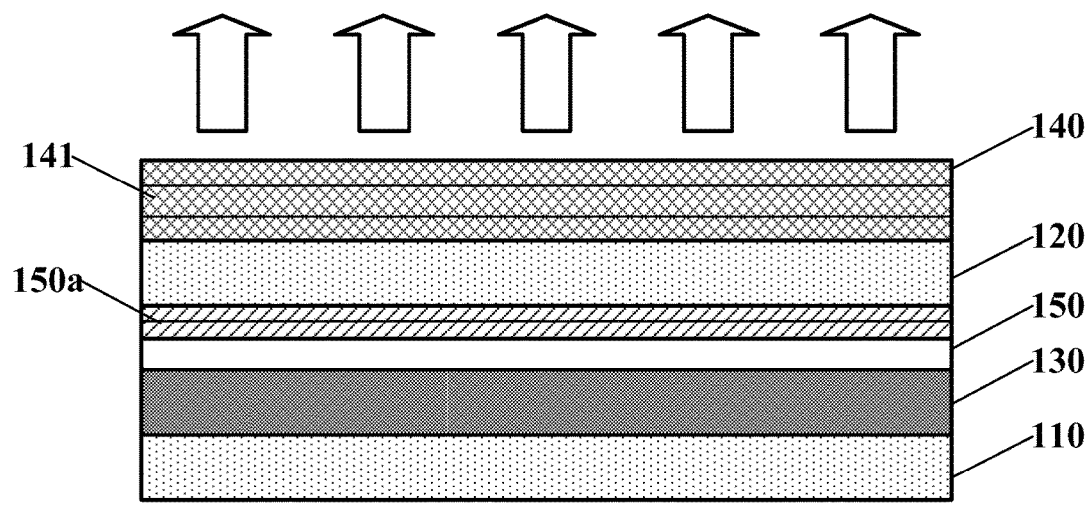

Optionally, the electron transport layer 150*a* includes at least a first electron transport layer and a second electron transport layer stacked in turn, as illustrated in FIG. 5C, and the second electron transport layer is positioned on the side surface of the second electrode 120 facing the light emitting layer 130. In the present embodiment, the electron transport layer 150*a* has a multi-film layer structure, so the effect for flexibly adjusting the refractive index of the electron transport layer 150*a* can be achieved by adjusting the different film layers. For example, the doping content of the first guest material in the different film layers may be adjusted such that the electron transport layer 150*a* has a desired refractive index parameter. The thickness of the optional first electron transport layer is 15 nm and the thickness of the second electron transport layer is 20 nm.

Figure 6:
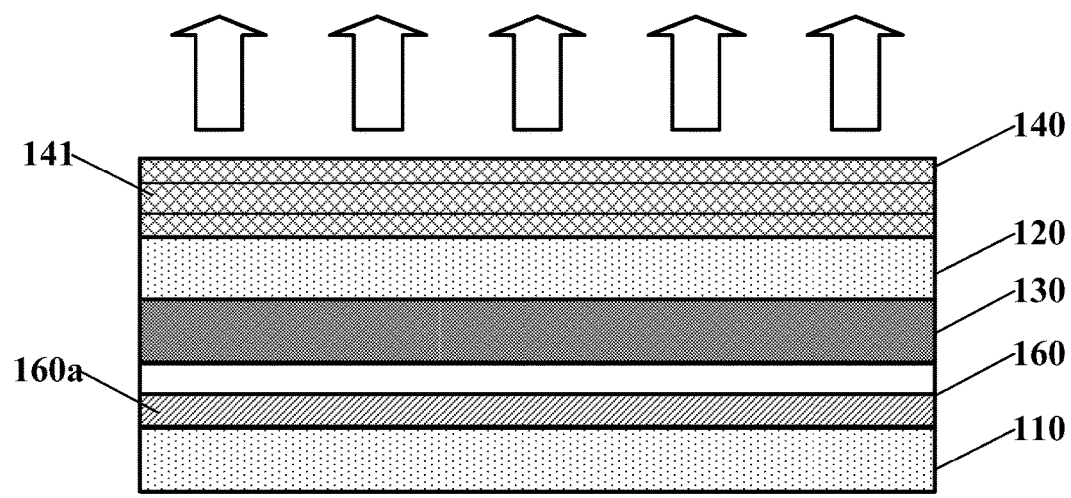
FIG. 6 is a schematic view of another organic light emitting display device according to another embodiment of the present disclosure.

Another embodiment of the present disclosure also provides another organic light emitting display device which differs from any of the embodiments described above in that, as shown in FIG. 6, it further includes a second functional layer 160 located on a side surface of the first electrode 110 facing the light emitting layer 130, where the second functional layer 160 includes at least a hole transport layer 160*a*.

In the present embodiment, the second functional layer 160 is located between the first electrode 110 and the light emitting layer 130, and the second functional layer 160 includes at least a hole transport layer 160*a*. The second functional layer 160 is used to enhance the ability that the hole of the first electrode 110 is injected and transported to the light emitting layer 130, thereby capable of balancing the injection and transport of the carriers and improving the carrier recombination efficiency. It will be appreciated by those skilled in the art that the second functional layer in other alternative embodiments may further include at least one of a hole injection layer and an electron blocking layer, so the second functional layer can not only improve the ability of the hole injection and transport, but also minimize the energy level barrier crossed when the hole transition takes place.

It will be understood by those skilled in the art that the constituent materials of the hole transport layer of the present disclosure includes any known hole transporting material, which is not particularly limited in the present disclosure.

Figure 7:
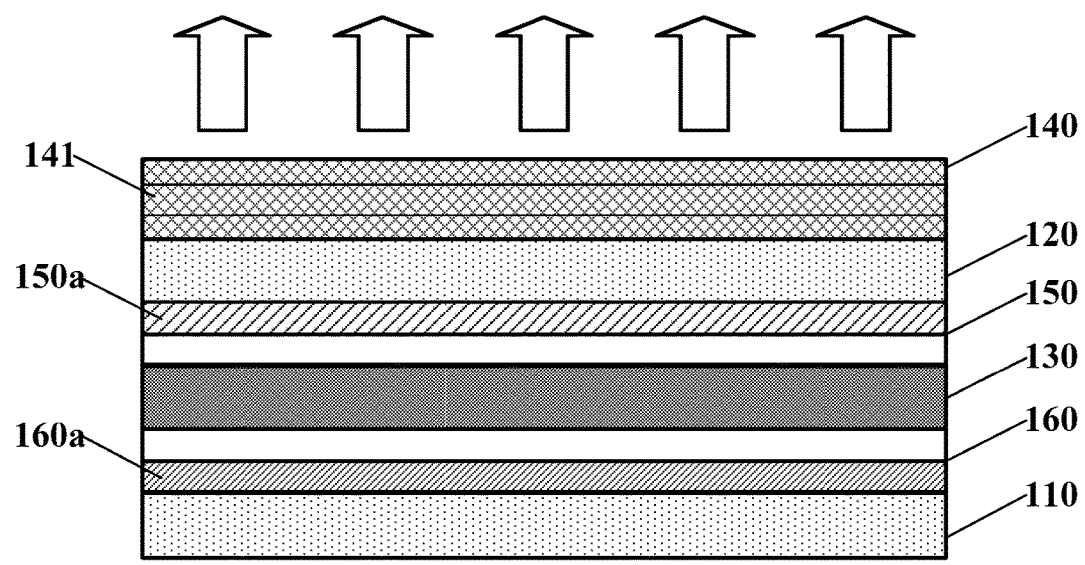
FIG. 7 is a schematic view of yet another organic light emitting display device according to another embodiment of the present disclosure.

Another embodiment of the present disclosure also provides an organic light emitting display device which differs from any of the above embodiments in that, as shown in FIG. 7, it further includes the first functional layer 150 and the second functional layer 160. The first functional layer 150 is located between the light emitting layer 130 and the second electrode 120, and includes at least an electron transport layer 150*a*, the second functional layer 160 is located between the first electrode 110 and the light emitting layer 130, and includes at least a hole transport layer 160*a*. As the first functional layer 150 and the second functional layer 160 are arranged in the organic light emitting display device, not only the injection and input capability of the electrons and the holes can be improved, but also the barrier obstacle occurred during the transition of the electrons and the holes can be reduced. The structure and function of the first functional layer and the second functional layer can be understood by those skilled in the art, and the detailed descriptions thereof are omitted here.

Figure 8:
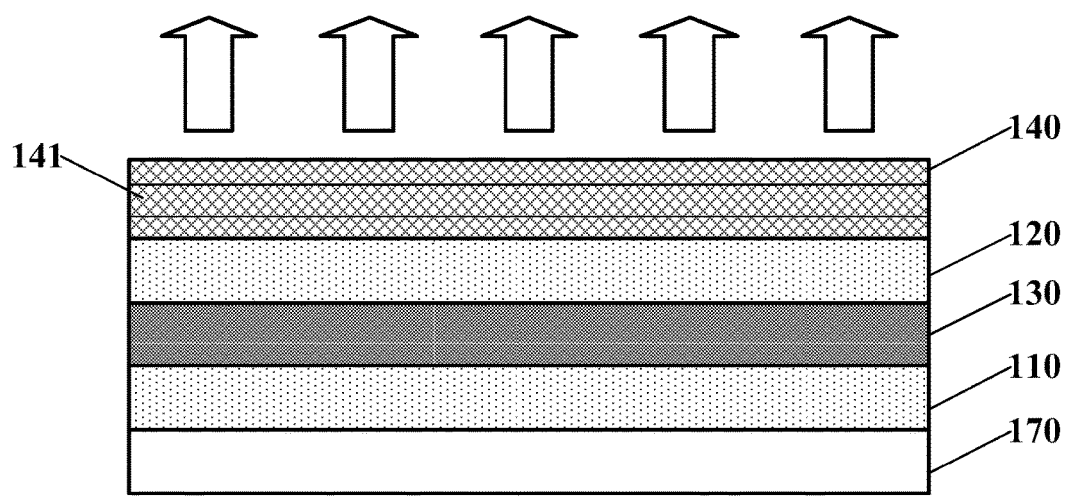
FIG. 8 is a schematic view of still another organic light emitting display device according to another embodiment of the present disclosure.
Figure 9:
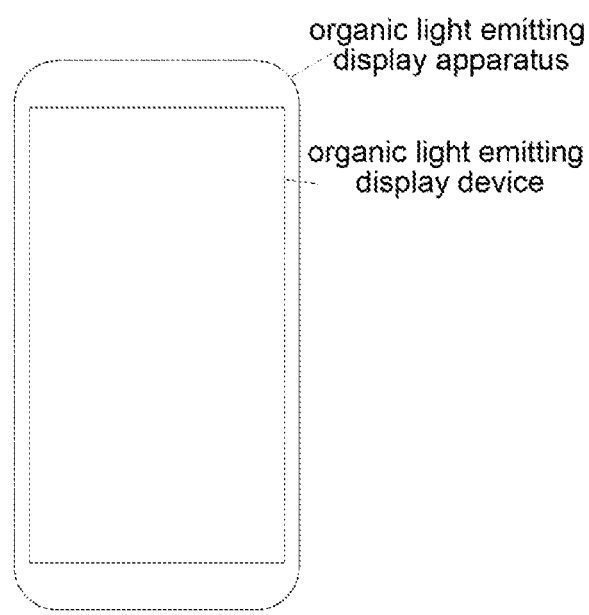
FIG. 9 is a schematic view of still another organic light emitting display apparatus according to another embodiment of the present disclosure.

Another embodiment of the present disclosure further provides still another organic light emitting display device which differs from any of the above embodiments in that, as shown in FIG. 8, it further includes a first substrate 170 located on a side surface of the first electrode 110 facing away from the light emitting layer 130, the first substrate 170 is a rigid substrate or a flexible substrate.

In the present embodiment, the first substrate 170 may be selected as the flexible substrate and encapsulated by using a thin film encapsulation layer, and the corresponding organic light emitting display device is a flexible organic light emitting display device having a lower power consumption and a bendable property, which is suitable for a variety of display devices, especially for wearable display devices. The material of the optional flexible substrate in this embodiment is a polyimide or polyethylene terephthalate resin. It will be understood by those skilled in the art that the material of the flexible substrate includes, but is not limited to, the above materials. Any material that can be utilized for the flexible substrate falls within the protection scope of the present disclosure. It will be appreciated by those skilled in the art that the first substrate includes, but is not limited to, the flexible substrate. In other alternative embodiments, the first substrate may be selected as the rigid substrate and encapsulated by a thin film encapsulation layer or a cover package, and accordingly a rigid organic light emitting display device is provided. The organic light emitting display device has a wide range of field of applications and will not be described or explained in detail in the present disclosure. Relevant practitioners can choose the material of the first substrate according to the requirements for products by themselves.

In order to clearly demonstrate the technical solution of the embodiment of the present disclosure, a further embodiment of the present disclosure provides an organic light emitting display device which includes an anode, a buffer layer, a hole transport layer, a light emitting layer, an electron transport layer (ETL), a cathode and a cap layer.

The anode is ITO, the thickness of the buffer layer is 10 nm, the thickness of the hole transport layer is 115 nm, the light emitting layer is a blue light emitting layer and has a thickness of 25 nm, the thickness of the electron transport layer is 30 nm, the material of the cathode is silver and its thickness is 15 nm, and the thickness of the cap layer is 70 nm.

Specifically, the difference between the various organic light emitting devices only lies in the following aspects.

The refractive index of the electron transport layer of the first organic light emitting display device Q1 is 1.72 at a wavelength of 550 nm; the refractive index of the electron transport layer of the second organic light emitting display device Q2 is 1.5 at a wavelength of 550 nm; and the refractive index of the electron transport layer of the third organic light emitting display device Q3 is 1.3 at a wavelength of 550 nm.

After optical tests, optical performances of Q1-Q3 are shown in Table 1 below:

|    | Refractive index of ETL@550 | Increased value of brightness | Color cast of perspective@60° |
|----|-----------------------------|-------------------------------|-------------------------------|
| Q1 | 1.72                        | 100%                          | 100%                          |
| Q2 | 1.5                         | 103%                          | 85%                           |
| Q3 | 1.3                         | 107%                          | 70%                           |

Taking the organic light emitting display device as indicated by Q1 as a comparison example, the refractive index of Q2 is less than the one of Q1, the increased value of brightness of Q2 is 103% of the brightness value of Q1, and the color cast of Q2 is 85% of the color cast value of Q1. It is clear that Q2 has a higher brightness and less color cast. Namely, the display effect of the organic light emitting display device as indicated by Q2 is better.

Taking the organic light emitting display device as indicated by Q1 as a comparison example, the refractive index of Q3 is less than the one of Q1, the increased value of brightness of Q3 is 107% of the brightness value of Q1, and the color cast of Q3 is 70% of the color cast value of Q1. It is clear that Q3 has a higher brightness and less color cast. Namely, the display effect of the organic light emitting display device as indicated by Q3 is better.

The refractive index of Q3 is less than that of Q2.

It can be seen that, it is possible to increase the brightness of the device and reduce the color cast by way of reducing the refractive index of the electron transport layer so that the effects of improving the light extraction efficiency of the device and reducing the color cast can be achieved.

A further embodiment of the present disclosure provides another organic light emitting display device which includes an anode, a buffer layer, a hole transport layer, a light emitting layer, a hole blocking layer, an electron transport layer (ETL), a cathode and a cap layer.

The anode is ITO, the thickness of the buffer layer is 10 nm, the thickness of the hole transport layer is 115 nm, the light emitting layer is a blue light emitting layer and has a thickness of 25 nm, the thickness of the hole blocking layer is 20 nm, the thickness of the electron transport layer is 35 nm, and the thickness of the cap layer is 70 nm.

Specifically, the difference between the various organic light emitting devices only lies in the following aspects.

The refractive index of the electron transport layer (ETL) of the first organic light emitting device Q1 is 1.70 at a wavelength of 550 nm, and the constituent materials of the ETL includes ETL1

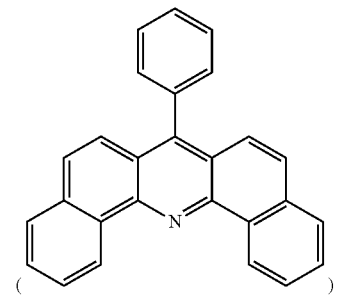 [SMILES: c1ccc(-c2c3ccc4ccccc4c3nc3c2ccc2ccccc23)cc1]

and Yb, ETL1:Yb=95:5, the material of the cathode is silver and its thickness is 18 nm.

The refractive index of the electron transport layer (ETL) of the second organic light emitting device Q2 is 1.60 at a wavelength of 550 nm, and the constituent materials of the ETL includes ETL1 and Yb, ETL1:Yb=25:75, the material of cathode is silver and its thickness is 18 nm.

The refractive index of the electron transport layer (EFL) of the third organic light emitting device Q3 is 1.65 at a wavelength of 550 nm, and the constituent materials of the ETL includes ETL1 and Yb, ETL1:Yb=50:50, the material of cathode is silver and its thickness is 18 nm.

The refractive index of the electron transport layer (ETL) of the fourth organic light emitting device Q4 is 1.8 at a wavelength of 550 nm, and the constituent materials of the ETL includes ETL2

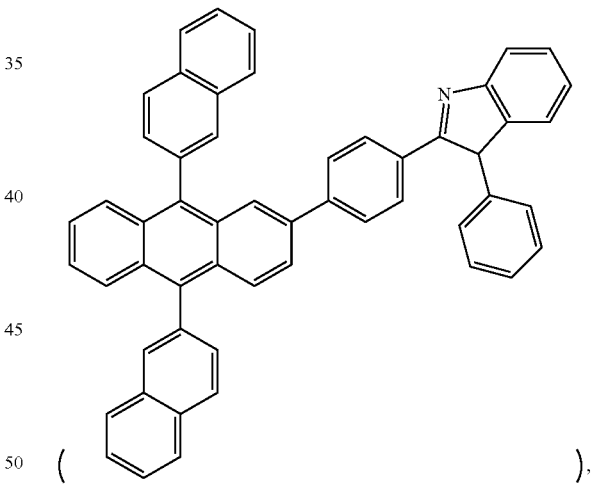

the material of the cathode is a magnesium silver alloy (Mg:Ag=10:1) and its thickness is 15 nm.

After optical tests, the optical performances of Q1-Q4 are shown in Table 2 below:

|    | Refractive index of ETL@550 | Light extraction efficiency | Color cast of perspective@60° |
|----|-----------------------------|------------------------------|-------------------------------|
| Q1 | 1.70                        | 110%                         | 95%                           |
| Q2 | 1.60                        | 115%                         | 92%                           |
| Q3 | 1.65                        | 113%                         | 95%                           |
| Q4 | 1.8                         | 100%                         | 100%                          |

Taking the organic light emitting display device as indicated by Q4 as a comparison example, the refractive index of Q1 is less than the one of Q4, the light extraction efficiency of Q1 is increased to 110% with respect to the one of Q4, and the color cast of Q1 is reduced to 95% with respect to the one of Q4. It is clear that the light extraction efficiency of Q1 is higher and the color cast thereof is less. That is, the organic light emitting display device as indicated by Q1 has a better display effect.

Taking the organic light emitting display device as indicated by Q4 as a comparison example, the refractive index of Q2 is less than the one of Q4, the light extraction efficiency of Q2 is increased to 115% with respect to the one of Q4, and the color cast of Q2 is reduced to 92% with respect to the one of Q4. It is clear that the light extraction efficiency of Q2 is higher and the color cast thereof is less. That is, the organic light emitting display device as indicated by Q2 has a better display effect.

Taking the organic light emitting display device as indicated by Q4 as a comparison example, the refractive index of Q3 is less than the one of Q4, the light extraction efficiency of Q3 is increased to 113% with respect to the one of Q4, and the color cast of Q3 is reduced to 95% with respect to the one of Q4. It is clear that the light extraction efficiency of Q3 is higher and the color cast thereof is less. That is, the organic light emitting display device as indicated by Q3 has a better display effect.

The refractive index at wavelength of 550 nm is Q2<Q3<Q1<Q4.

It can be seen that the light extraction efficiency of the device can be improved and the color cast can be reduced by way of reducing the refractive index of the electron transport layer and improving the material of the cathode, thereby improving the display effect of the device.

Yet another embodiment of the present disclosure provides yet another organic light emitting display device which includes an anode, a buffer layer, a hole transport layer, a light emitting layer, an electron transport layer (ETL), a cathode and a cap layer (CPL).

The anode is ITO, the thickness of the buffer layer is 10 nm, the thickness of the hole transport layer is 115 nm, the light emitting layer is a blue light emitting layer and its thickness is 25 nm, the thickness of the electron transport layer is 35 nm and its constituent materials includes ETL1

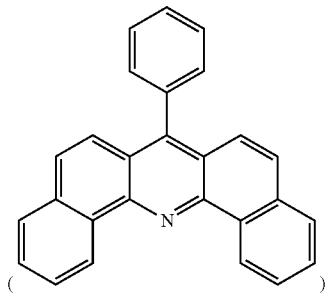 [SMILES: c1ccc(-c2c3ccc4ccccc4c3nc3c2ccc2ccccc23)cc1]

and Yb, the material of the cathode is silver and its thickness is 15 nm, and the thickness of the cap layer is 70 nm.

Specifically, the difference between the various organic light emitting devices only lies in the following aspects.

In the electron transport layer (ETL) of the first organic light emitting display device Q1, ETL1:Yb=95:5, and the constituent materials of the cap layer is ALQ3.

In the second organic light emitting display device Q2, ETL1:Yb=95:5, the cap layer includes a first cap layer and a second cap layer, the constituent materials of the first cap layer is ALQ3 and its thickness is 50 nm, and the constituent materials of the second cap layer is LiF and its thickness is 20 nm.

In the third organic light emitting display device Q3, ETL1:Yb=50:50, the cap layer includes a first cap layer and a second cap layer, the constituent materials of the first cap layer is ALQ3 and its thickness is 50 nm, and the constituent materials of the second cap layer is LiF and its thickness is 20 nm.

After optical tests, the optical performances of Q1-Q3 are shown in Table 3 below:

| | ETL | CPL | Light extraction efficiency | Color cast@60° |
|---|---|---|---|---|
| Q1 | ETL1:Yb = 95:5 | ALQ3 | 100% | 100% |
| Q2 | ETL1:Yb = 95:5 | ALQ3/LiF | 105% | 90% |
| Q3 | ETL1:Yb = 50:50 | ALQ3/LiF | 110% | 80% |

Taking the organic light emitting display device as indicated by Q1 as a comparison example, the cap layer of Q2 is of a double-film layer structure, and the light extraction efficiency of Q2 is increased to 105% with respect to the one of Q1, and the color cast of Q2 is reduced to 90% with respect to the one of Q1. It is clear that the light extraction efficiency of Q2 is higher and its color cast is less. That is, the organic light emitting device as indicated by Q2 has a better display effect.

Taking the organic light emitting display device as indicated by Q1 as a comparison example, the cap layer of Q3 is of a double-film layer structure, and the light extraction efficiency of Q3 is increased to 110% with respect to the one of Q1, and the color cast of Q3 is reduced to 80% with respect to the one of Q1. It is clear that the light extraction efficiency of Q3 is higher and its color cast is less. That is, the organic light emitting device as indicated by Q3 has a better display effect.

Among them, the difference between Q3 and Q2 lies in that the proportion of the constituent materials of the electron transport layer is different, and the refractive index of ALQ3 is greater than that of LiF. It can be seen that the light extraction efficiency of the device can be improved and its color cast can be reduced by improving the film layer structure of the cap layer and the refractive index of each film layer, and by adjusting the constituent materials and material content of the electron transport layer, thereby improving the display effect of the device.

The embodiment of the present disclosure also provides an organic light emitting display apparatus which includes an organic light emitting display device as described in any of the embodiments as described above. The organic light emitting display apparatus may be a top-emitting structure in which the light emitted from the light emitting layer is emitted through one side surface of the second electrode.

According to the organic light emitting display apparatus of the present embodiment, the light emitting layer may be formed of a color light emitting material. For example, a first light emitting region corresponding to an R pixel region is formed of a red light emitting material, a second light emitting region corresponding to a G pixel region is formed of a green light emitting material, and a third light emitting region corresponding to a B pixel region is formed of a blue light emitting material. In other embodiments, however, the optional light emitting layer is formed of a white light emitting material, and the organic light emitting display apparatus further includes a red filter film provided in correspondence with the first light emitting region, and as a result, the white light emitted from the first light emitting region forms red lights after passing through the red filter film; a green filter film is provided in correspondence with the second light emitting region, and as a result, the white light emitted from the second light emitting region form green lights after passing through the green filter film; and a blue filter film is provided in correspondence with the third light emitting region, and as a result, the white light emitted from the third light emitting region form blue lights after passing through the green filter film.

The organic light emitting display apparatus provided in the present embodiment can be applied to a wearable smart bracelet or a display field such as a smart phone, a tablet computer and the like.

It is noted that the foregoing are only some embodiments of and the technical principles provided by the present disclosure. It will be understood by those skilled in the art that the present disclosure is not limited to the specific embodiments described herein, and that various changes, remodifications and substitutions will be made apparently by those skilled in the art without departing from the scope of the disclosure. Thus, while the present disclosure has been described in more detail by way of the above embodiments, the present disclosure is not limited to the above embodiments, but may include more equivalent embodiments without departing from the concept of the present disclosure, and the scope of the present disclosure is to be determined by the scope of the appended claims.

What is claimed is:

1. An organic light emitting display device, comprising:
a first electrode and a second electrode disposed opposite to each other;
a light emitting layer positioned between the first electrode and the second electrode;
a cap layer positioned on a side surface of the second electrode facing away from the light emitting layer, wherein the cap layer comprises at least two composite layers, wherein a refractive index of the composite layer of the at least two composite layers closer to the second electrode is greater than that of the other composite layer further away from the second electrode in a range of wavelength of 400 nm to 700 nm, and when light propagates in the at least two composite layers, a light emission angle in the other composite layer of the at least two composite layers further away from the second electrode is greater than a light emission angle in the composite layer of the at least two composite layers closer to the second electrode; and
a first functional layer comprising at least an electron transport layer, wherein the electron transport layer is located on a side surface of the second electrode facing to the light emitting layer, a refractive index of the electron transport layer is less than 1.7 in the wavelength range of 400 nm to 700 nm, and a thickness of the electron transport layer is greater than or equal to 30 nm and less than or equal to 40 nm.

2. The organic light emitting display device according to claim 1, wherein a thickness of the cap layer is greater than or equal to 50 nm and less than or equal to 90 nm.

3. The organic light emitting display device according to claim 1, wherein the cap layer comprises at least one or both of an organic material and an inorganic material.

4. The organic light emitting display device according to claim 3, wherein the cap layer comprises a first composite layer and a second composite layer stacked on the first composite layer, the first composite layer is in direct contact with the second electrode, a refractive index of the first composite layer is greater than 1.8 in the wavelength range of 400 nm to 700 nm, and a refractive index of the second composite layer is less than 1.7 in the wavelength range of 400 nm to 700 nm.

5. The organic light emitting display device according to claim 4, wherein a thickness of the first composite layer is 50 nm and a thickness of the second composite layer is 20 nm.

6. The organic light emitting display device according to claim 4, wherein the first composite layer is 8-hydroxyquinoline aluminum and the second composite layer is lithium fluoride.

7. The organic light emitting display device according to claim 1, wherein the electron transport layer comprises an electron transporting material doped with a first guest material.

8. The organic light emitting display device according to claim 7, wherein the first guest material comprises at least an alkali metal, an alkaline earth metal and a rare earth metal; and the electron transport material comprises any one of an o-phenanthroline derivative or a substituted product thereof and a bipyridine derivative or a substituted product thereof.

9. The organic light emitting display device according to claim 7, wherein a content of the first guest material in the electron transport layer is greater than or equal to 5% and less than or equal to 95%.

10. The organic light emitting display device according to claim 1, wherein the first functional layer further comprises: a hole blocking layer located at a side surface of the electron transport layer facing the light emitting layer, a thickness of the hole blocking layer is in the range from 5 nm to 30 nm.

11. The organic light emitting display device according to claim 1, wherein the electron transport layer comprises at least a first electron transport layer and a second electron transport layer stacked in turn, and the second electron transport layer is located on a side surface of the second electrode facing the light emitting layer.

12. The organic light emitting display device according to claim 11, wherein a thickness of the first electron transport layer is 15 nm and a thickness of the second electron transport layer is 20 nm.

13. The organic light emitting display device according to claim 1, wherein constituent materials of the second electrode comprises a metal material or a metal alloy material, and the constituent materials of the first electrode comprises indium tin oxide (ITO) or indium zinc oxide (IZO); or,
the constituent materials of the second electrode comprises indium tin oxide (ITO) or indium zinc oxide (IZO), and the constituent materials of the first electrode comprises a metal material or a metal alloy material.

14. The organic light emitting display device according to claim 13, wherein the metal material is silver, and the metal alloy material is a silver alloy having a silver content of more than 90%.

15. The organic light emitting display device according to claim 1, further comprising a second functional layer located on a side surface of the first electrode facing the light emitting layer, the second functional layer comprise at least a hole transport layer.

16. The organic light emitting display device according to claim 1, further comprising a first substrate located on a side surface of the first electrode facing away from the light emitting layer, the first substrate is a rigid substrate or a flexible substrate.

17. The organic light emitting display device according to claim 1, wherein the organic light emitting display device is a top-emitting display device.

18. An organic light emitting display apparatus comprising
  an organic light emitting display device, comprising:
  a first electrode and a second electrode disposed opposite to each other;
  a light emitting layer positioned between the first electrode and the second electrode, and
  a cap layer positioned on a side surface of the second electrode facing away from the light emitting layer, wherein the cap layer comprises at least two composite layers, a refractive index of the composite layer of the at least two composite layers closer to the second electrode is greater than that of the other composite layer further away from the second electrode in a range of wavelength of 400 nm to 700 nm, and when light propagates in the at least two composite layers, a light emission angle in the composite layer of the at least two composite layers further away from the second electrode is greater than a light emission angle in the composite layer of the at least two composite layers closer to the second electrode; and
  a first functional layer comprising at least an electron transport layer, wherein the electron transport layer is located on a side surface of the second electrode facing to the light emitting layer, a refractive index of the electron transport layer is less than 1.7 in the wavelength range of 400 nm to 700 nm, and a thickness of the electron transport layer is greater than or equal to 30 nm and less than or equal to 40 nm.

* * * * *